(12) United States Patent
Abbott et al.

(10) Patent No.: US 8,697,496 B1
(45) Date of Patent: Apr. 15, 2014

(54) METHOD OF MANUFACTURE INTEGRATED CIRCUIT PACKAGE

(71) Applicant: Texas Instruments Incorporated, Dallas, TX (US)

(72) Inventors: Donald Charles Abbott, Norton, MA (US); Ubol Annie Udompanyavit, Dallas, TX (US); Brian Eugene Parks, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/644,647

(22) Filed: Oct. 4, 2012

(51) Int. Cl.
  *H01L 21/50* (2006.01)
(52) U.S. Cl.
  USPC .............................. 438/123; 123/107; 123/111

(58) Field of Classification Search
  USPC .......... 438/107–113, 123–124; 257/659–666, 257/669
  See application file for complete search history.

(56) References Cited

U.S. PATENT DOCUMENTS

| | | | |
|---|---|---|---|
| 7,005,325 B2 * | 2/2006 | Chow et al. .................... | 438/123 |
| 7,847,391 B2 * | 12/2010 | Udompanyavit et al. ..... | 257/692 |
| 8,129,228 B2 | 3/2012 | Udompanyavit et al. | |

* cited by examiner

*Primary Examiner* — Dung A. Le
(74) *Attorney, Agent, or Firm* — Steven A. Shaw; Wade James Brady, III; Frederick J. Telecky, Jr.

(57) ABSTRACT

An integrated circuit package may be formed using a leadframe having an open space extending therethrough. A shunt is located within the open space such that it is not in contact with any portion of the leadframe. Tape may be applied to the lower surface of the leadframe to support the shunt and hold it in place relative to the leadframe until wirebonding and encapsulation have been completed. Thereafter, the tape may be removed.

15 Claims, 7 Drawing Sheets

US 8,697,496 B1

METHOD OF MANUFACTURE INTEGRATED CIRCUIT PACKAGE

BACKGROUND

An integrated circuit package serves to physically and electrically connect an integrated circuit device (housed within the integrated circuit package) to a printed circuit board. One type of integrated circuit package is known as a "flat no-leads package". This type of package is a surface-mount technology that connects an integrated circuit device to surfaces of the printed circuit board without the use of through-holes. Perimeter lands on the package bottom provide electrical connections to the printed circuit board. Flat no-leads packages typically include a planar copper leadframe substrate upon which the integrated circuit device is mounted. The leadframe and the integrated circuit device are typically encapsulated within a molding material. Flat no-lead packages generally include an exposed thermal pad to improve heat transfer out of the integrated circuit device (and into the printed circuit board). There are various types of flat no-leads packages in use, including QFN (quad-flat no-leads) and DFN (dual-flat no-leads) variations.

For certain integrated circuit package applications, it is required that a rectangular copper alloy slug or shunt be included in the package with one surface exposed for soldering.

DETAILED DESCRIPTION

As discussed previously, for certain integrated circuit package applications, it is required that a rectangular copper alloy slug or shunt be included in the package with one surface exposed for soldering. The copper alloy used in the shunt may, for example, be of the type sold under the trademark MANGANIN®, and may, for example, have a composition of about 86% copper, 12% manganese, and 2% nickel. Because of the relatively high cost of this alloy, it is advantageous to have the leadframe formed from a less expensive leadframe alloy, for example, the alloy sold under the trade designation "CDA194". CDA194 is well suited and characterized both thermally and mechanically for use in leadframes. It is also formulated to facilitate stamping and etching of leadframes.

In general terms, an integrated circuit package, along with a method of manufacturing the package, are disclosed herein. The disclosed package and method of manufacture provide the ability, for example, to incorporate a slug or shunt made of a more expensive copper alloy (e.g., MANGANIN®) into a package having its leadframe manufactured from a less expensive leadframe alloy. The alloy CDA194, as mentioned above, is widely used for leadframes and is readily available from rolling mills. MANGANIN®, however, is generally less widely used and available.

Figure 1:
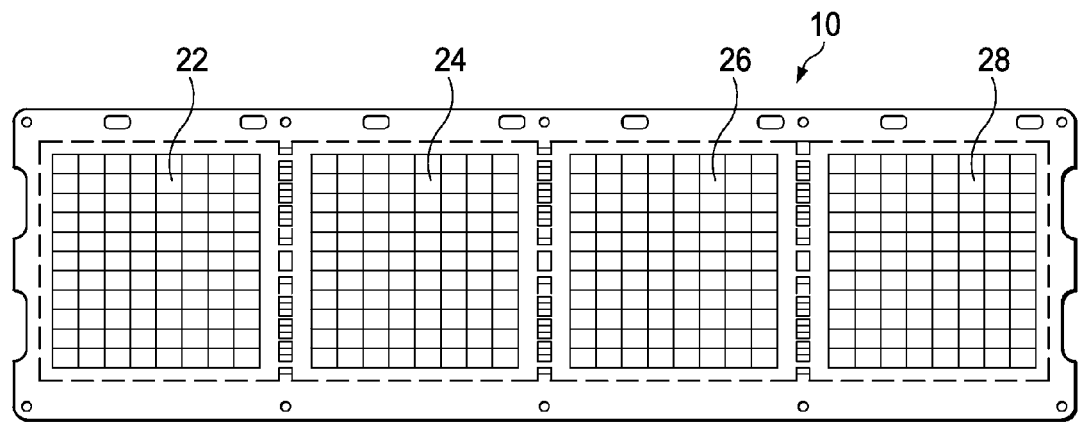
FIG. 1 is a plan view of exemplary block of connected leadframe sheets.
Figure 2:
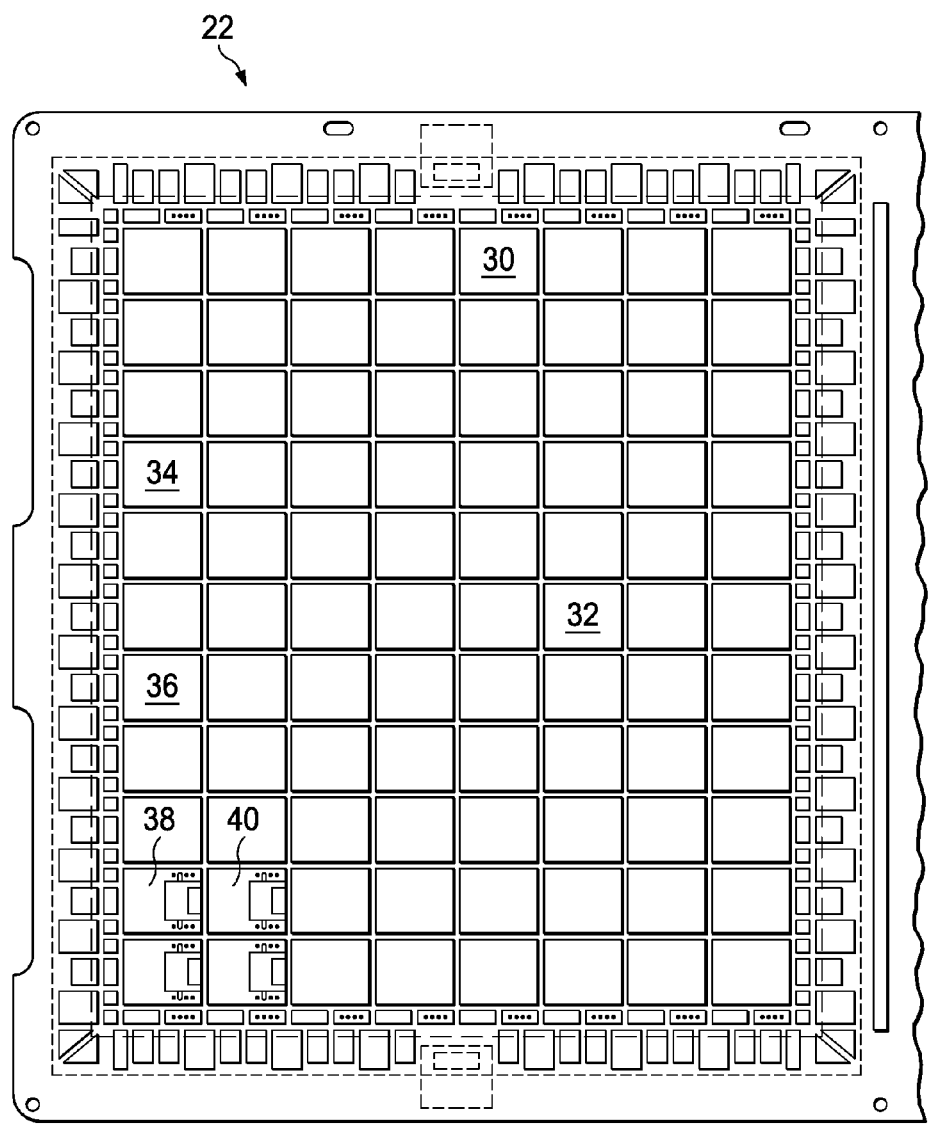
FIG. 2 is a plan view of one of the leadframe sheets of FIG. 1.
Figure 3:
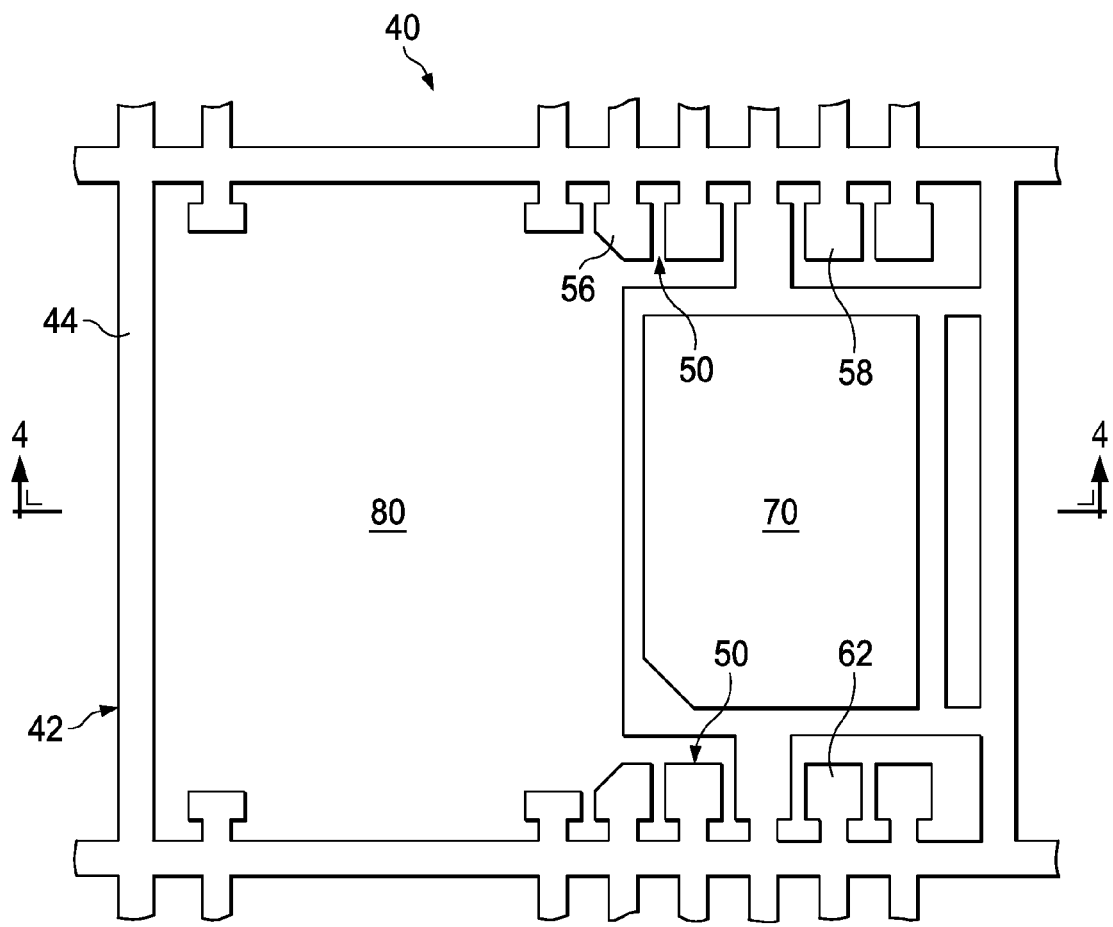
FIG. 3 is a plan view of an exemplary leadframe from the leadframe sheet of FIG. 2.

The process of manufacturing the package disclosed herein begins by providing a leadframe, e.g., the leadframe 40, FIG. 3. FIG. 1 illustrates a block 10 of connected leadframe sheets 22, 24, 26, and 28. FIG. 2 illustrates the leadframe sheet 22 in further detail, it being understood that the remaining leadframe sheets 24, 26, and 28 may be substantially identical to the leadframe sheet 22. With reference to FIG. 2, the leadframe sheet 22 may include a plurality (e.g., eighty-eight, as depicted in FIG. 2) of leadframes 30 including the individual leadframes 32, 34, 36, 38 and 40.

FIG. 3 illustrates the leadframe 40 in further detail, it being understood that the remainder of the leadframes 30 may be substantially identical to the leadframe 40. It is noted that, for purposes of illustrative efficiency, the package and method of manufacture will be described herein specifically in conjunction with the exemplary leadframe 40. It is to be understood, however, that the methodology described may be carried out on all of the leadframes 30 while they are still connected to one another in the leadframe sheet 22 and while the leadframe sheets 22, 24, 26, and 28 are still connected to one another in the leadframe block 10.

Figure 4:
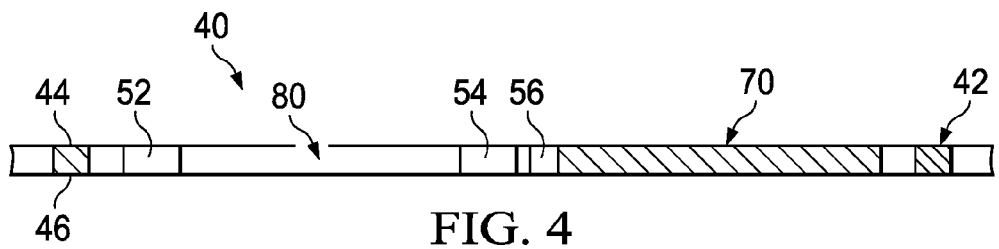
FIG. 4 is a cross-section view of the leadframe of FIG. 3, taken along the line 4-4 in FIG. 3.

With reference now to FIG. 3, the leadframe 40 may include a frame portion 42 having an upper surface 44 and an oppositely disposed lower surface 46 (FIG. 4). A plurality of tabs 50, including the individual tabs 56, 58, and 62, may extend inwardly from the frame 42, as shown. The tops of the tabs 50 are the targets for wire bonding connections to the integrated circuit device (in a manner that will be described in further detail herein). With reference again to FIG. 3, the right side (as viewed in the orientation of FIG. 3) of the leadframe 40 may be occupied by a die mounting pad 70 for mounting an integrated circuit device, in a manner as will be described in further detail herein. The left side of the leadframe 40 may include an open space 80 that extends completely through the leadframe, i.e., the open space 80 extends from the upper surface 44 to the lower surface 46 of the leadframe 40.

The leadframe 40 may be constructed from a relatively inexpensive leadframe alloy, for example, the alloy sold under the trade designation "CDA194". Alternatively, the leadframe 40 may be constructed of copper or another copper alloy, other metal or metal alloy.

Figure 5:
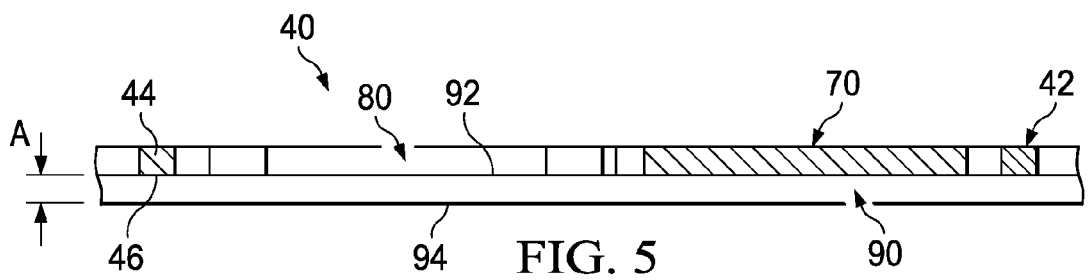
FIG. 5 is a cross-section view similar to that of FIG. 4, but showing the leadframe of FIG. 3 having tape applied to its lower surface.

Continuing with the description of the methodology, and with reference now to FIG. 5, tape 90 may be adhered to the lower surface 46 of the leadframe 40 such that it extends beneath the entire extent of the leadframe. Tape 90 may include an upper surface 92 and an oppositely disposed lower surface 94. To adhere the tape 90 to the leadframe 40, the upper surface 92 of the tape 90 may be adhered to the lower surface 46 of the frame portion 42 in areas where the tape 90 underlies the frame portion 42. The tape 90 may, for example, be either a pressure sensitive adhesive tape or a thermoplastic tape and may have a thickness "A", for example, of about 2 mil-50 µm. It is noted that the relative thickness of the tape 90 has been exaggerated in FIG. 5 for purposes of illustrative clarity.

Figure 6:
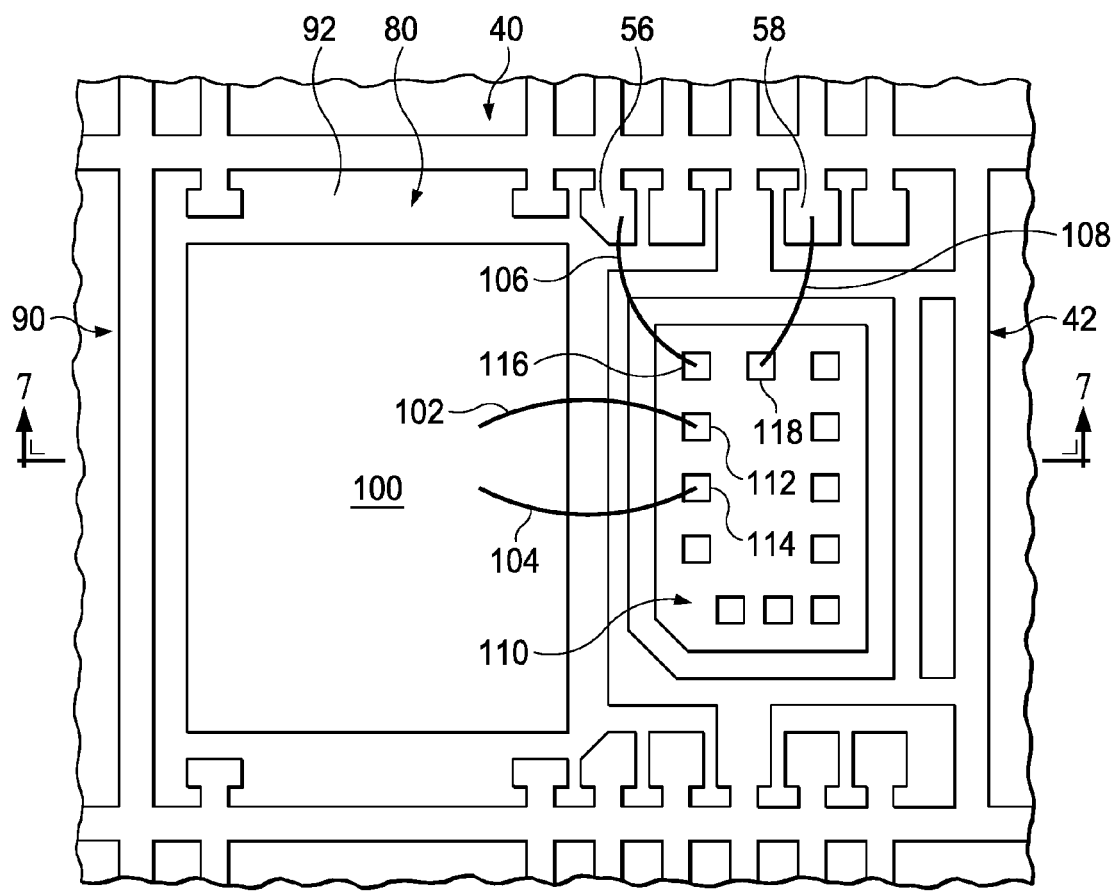
FIG. 6 is a plan view of the leadframe of FIG. 3, illustrating a shunt supported on the tape shown in FIG. 5, an integrated circuit device mounted on a die pad of the leadframe and wirebonding between the integrated circuit device, the shunt and the leadframe.
Figure 7:
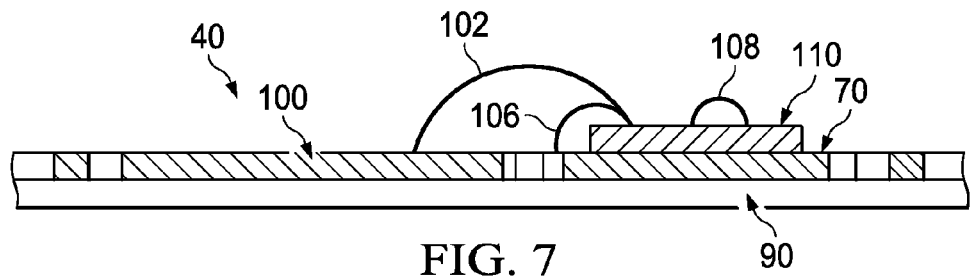
FIG. 7 is a cross-section view of the leadframe of FIG. 6, taken along the line 7-7 in FIG. 6.

With reference to FIGS. 6 and 7, after the tape 90 has been applied, a shunt 100 may be inserted into the open space 80 of the leadframe 40. As can be appreciated from FIG. 6, the shunt 100 may be located such that it does not touch any part of the leadframe frame portion 42 and is supported only by the tape 90. The shunt 100 may be placed within the open space 80 of the leadframe 40 using conventional die mount, pick and place equipment. It is noted that the shunt 100 may be formed in a large sheet of interconnected shunts (not shown). The shunts may then be separated from one another prior to insertion into the leadframes. The shunt 100 may, for example, be formed from a relatively expensive material such as a copper alloy sold under the trademark MANGANIN®. The shunt may be pre-plated or post-plated, as desired.

With further reference to FIGS. 6 and 7, an integrated circuit device 110 may be mounted to the leadframe 40, as shown. More specifically, the Integrated circuit device 110 can be attached to the die mounting pad 70 in a conventional manner, using an adhesive material such as epoxy or silver filled epoxy.

Next, with continued reference to FIGS. 6 and 7, the integrated circuit device 110 may be electrically connected to the shunt 100 and the leadframe 40, for example, using bonding wires. Bonding wires 102 and 104, for example, may extend between the shunt 100 and the pads 112 and 114, respectively, on the integrated circuit device 110. A bonding wire 106 may extend between the integrated circuit device pad 116 and the top of the leadframe tab 56. In a similar manner, a bonding wire 108 may extend between the integrated circuit device pad 118 and the top of the leadframe tab 58. For purposes of illustrative clarity, only four bonding wires have been shown in FIG. 6. It is to be understood, however, that many more bonding wires may be provided to establish the desired connections between the integrated circuit device 110, the leadframe 40 and shunt 100.

After wire bonding has been completed, in a manner as described above, the leadframe 40, integrated circuit device 110 and shunt 100 may be encapsulated within a molding material (e.g., the molding material 122, FIG. 8) in a conventional manner. The molding material may, for example, be a plastic material such as epoxy or other conventional insulating material. The molding material 122 may be formed in an injection molding process or it may be applied as a coating.

Once the molding material has been applied and it has hardened, it serves to secure the location of the shunt 100 relative to the leadframe 40. Accordingly, after the encapsulation step has been completed, the tape 90 may be removed from the leadframe 40. Thereafter, the individual leadframes in the leadframe sheet 22 may be separated into individual integrated circuit packages, such as the integrated circuit package 120, FIG. 8. After encapsulation and separation have been completed, in a manner as described above, the tabs 50 may be electrically isolated from one another in a conventional manner.

Figure 8:
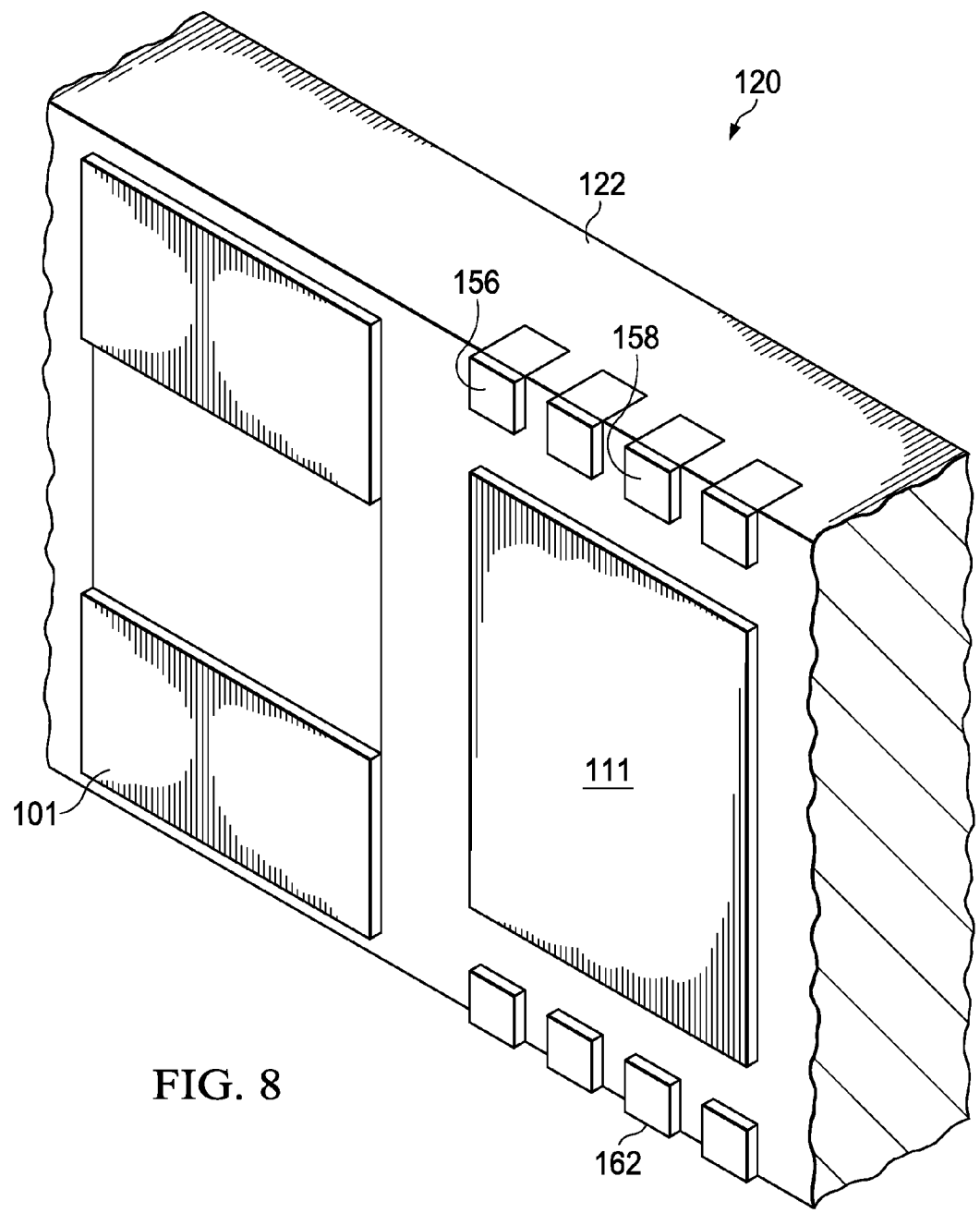
FIG. 8 is a perspective view of a completed integrated circuit package.

FIG. 8 schematically illustrates the completed integrated circuit package 120 after encapsulation and separation have been completed, in a manner as described above. As can be seen from FIG. 8, the molding material 122 may encompass the leadframe 40, the shunt 100 and the integrated circuit device 110, except for the bottom 101 of the shunt 100, the bottom 111 of the die pad and the bottoms of the tabs 50 (e.g., the bottoms 156, 158, and 162 of the tabs 56, 58, and 62, respectively). These areas are left exposed (i.e., not covered by the molding material 122) in order to facilitate later soldering to an underlying printed circuit board or the like. Use of the tape 90, in a manner as previously described herein, serves to prevent molding material from covering these surfaces during the encapsulation process.

The bottoms of the tabs 50 (e.g., the bottoms 156, 158, and 162 of the tabs 56, 58, and 62, respectively) facilitate later solder connection of the integrated circuit package 120 to corresponding pads on an underlying printed circuit board or the like. As can be appreciated, once the integrated circuit package 120 has been attached, for example, to an underlying printed circuit board, a distinct electrical pathway will be established from each pad on the integrated circuit device 110 (e.g., one of the integrated circuit device pads 112, 114, 116, 118, FIG. 6) and a corresponding pad on the printed circuit board. With reference, for example, to the tab 58, electrical continuity will be established between the corresponding printed circuit board pad and the tab 58 via a solder joint extending between the printed circuit board pad and the bottom 158 of the electrically conductive tab 58. Continuity is also established between the top of the tab 58 and the pad 118 of the integrated circuit device via the bonding wire 108. Accordingly, in this manner, a continuous and distinct electrical pathway is established between the pad 118 of the integrated circuit device 110 and a corresponding pad on the underlying printed circuit board.

Figure 9:
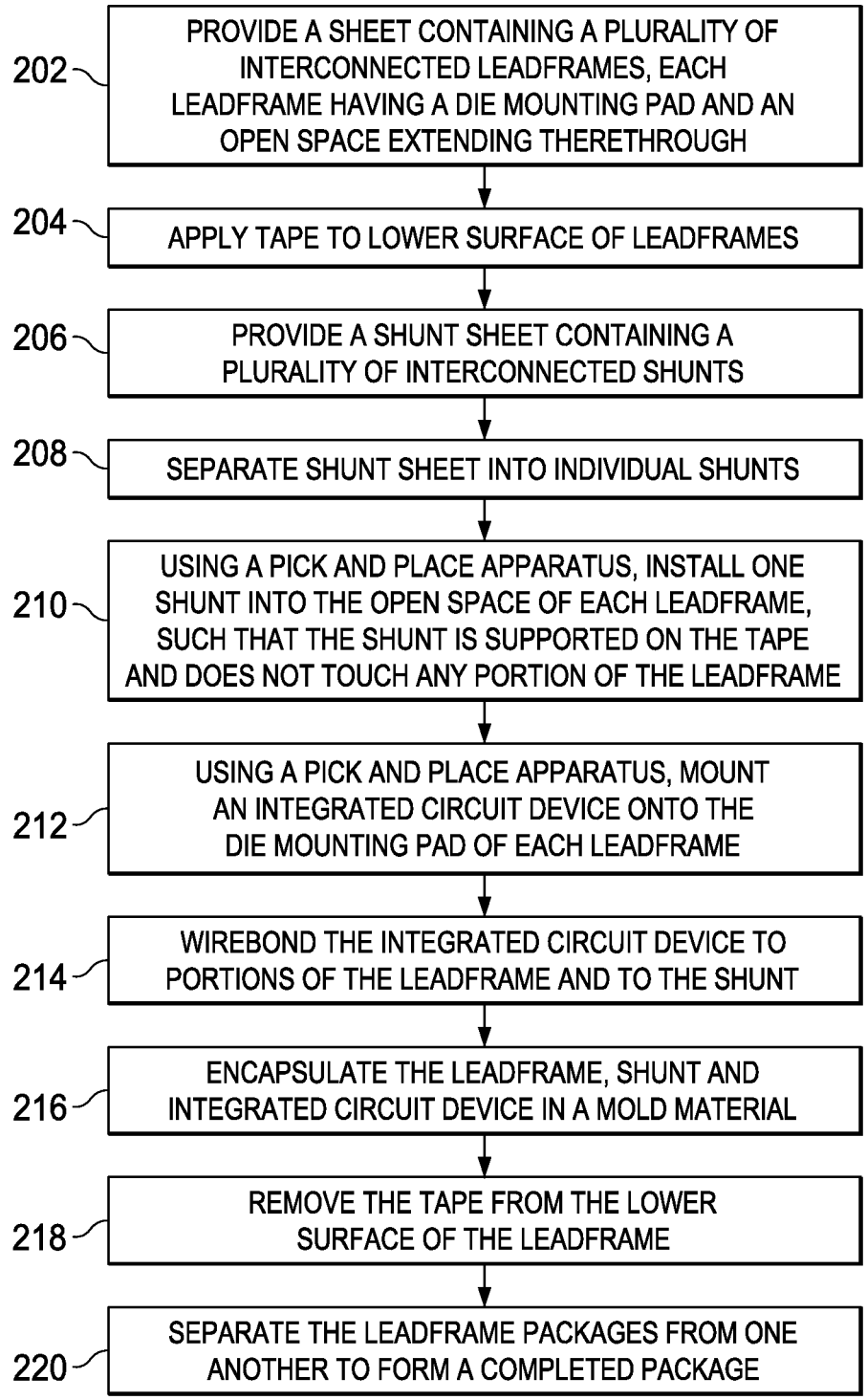
FIG. 9 illustrates by flow diagram, selected steps in an exemplary method for manufacturing an integrated circuit package according to the present disclosure.

FIG. 9 is a flowchart illustrating an exemplary method of manufacturing described herein. With reference now to FIG. 9, step 202 includes providing a sheet 22 (FIGS. 1-2) containing a plurality of interconnected leadframes 30, each leadframe (e.g., the leadframe 40, FIG. 3) having a die mounting pad 70 and an open space 80 extending therethrough. Step 204 includes applying tape 90 (FIGS. 5-6) to a lower surface of the leadframes 30. Step 206 encompasses providing a shunt sheet containing a plurality of interconnected shunts (e.g., the shunt 100, FIG. 6). Step 208 includes separating the shunt sheet into individual shunts (e.g., the shunt 100, FIG. 6). Step 210 describes, using a pick and place apparatus, installing one shunt 100 (FIG. 6) into the open space 80 of each leadframe 40, such that the shunt 100 is supported on the tape 90 and does not touch any portion of the leadframe 40. Step 212 includes, using a pick and place apparatus, mounting an integrated circuit device 110 (FIG. 6) onto the die mounting pad 70 of each leadframe. Step 214 includes wirebonding the integrated circuit device 110 to portions of the leadframe 40 and to the shunt 100 (FIG. 6). Step 216 includes encapsulating the leadframe 40, shunt 100 and integrated circuit device 110 in a molding material 122 (FIG. 8). Step 218 encompasses removing the tape 90 from the lower surface of the leadframe 40. Finally, step 220 includes separating the individual leadframe units from one another to form a completed integrated circuit package 120 (FIG. 8). This separating step may, for example, be accomplished by a sawing process.

Figure 10:
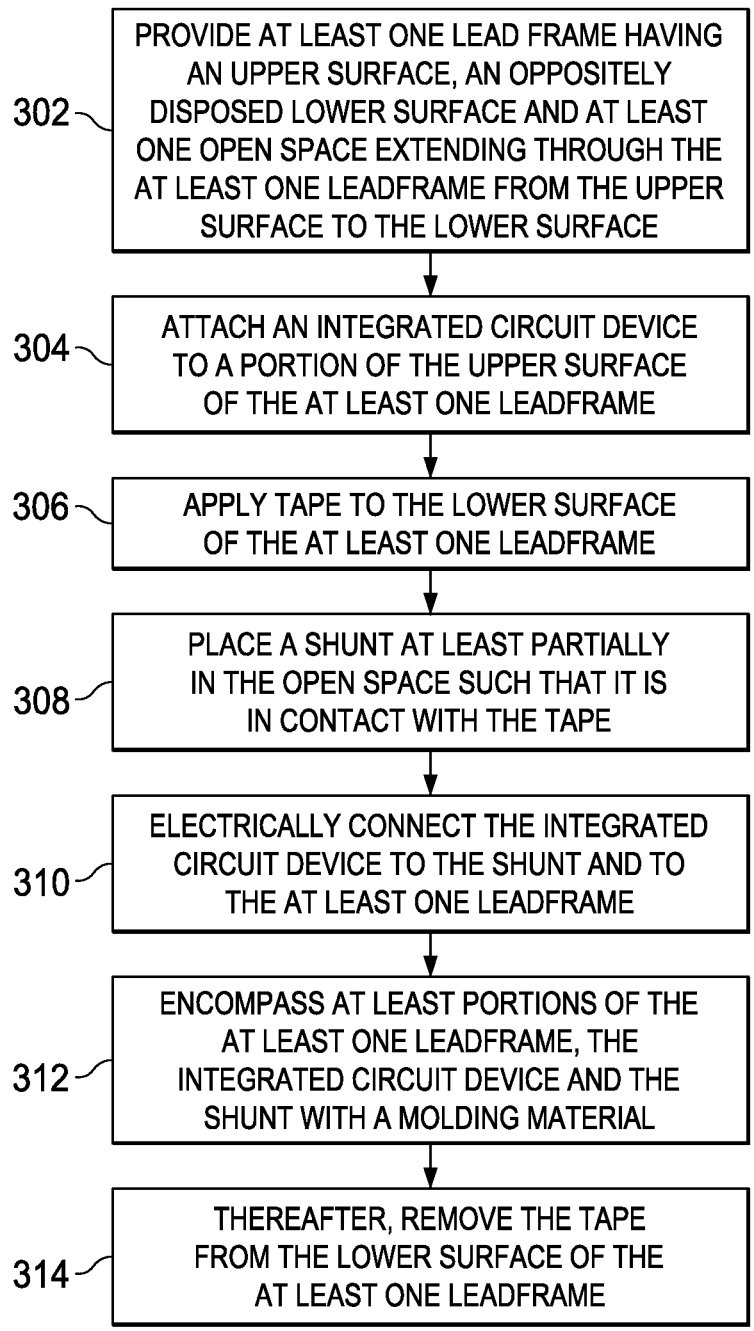
FIG. 10 illustrates by flow diagram, one embodiment of a method of manufacturing an integrated circuit package.
Figure 11:
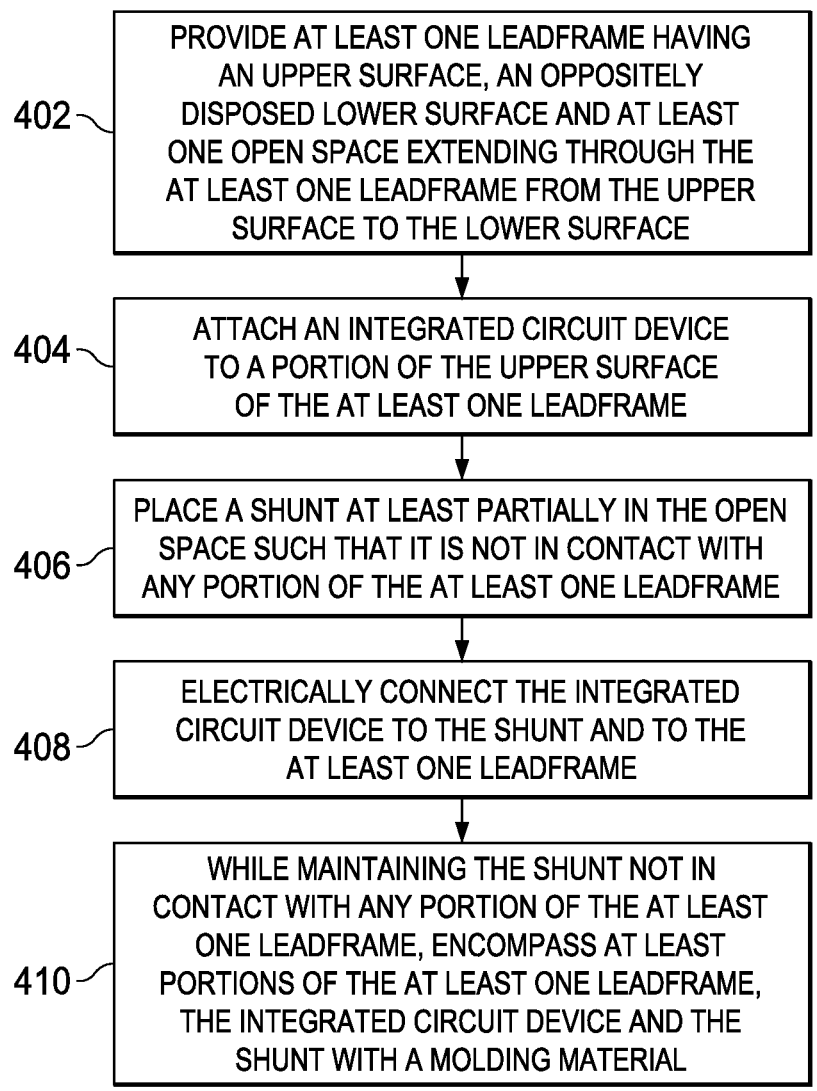
FIG. 11 illustrates by flow diagram, another embodiment of a method of manufacturing an integrated circuit package.

FIG. 10 is a flowchart depicting one embodiment of a method of manufacturing an integrated circuit package. With reference now to FIG. 10, step 302 includes providing at least one lead frame having an upper surface, an oppositely disposed lower surface and at least one open space extending through the at least one leadframe from the upper surface to the lower surface. Step 304 includes attaching an integrated circuit device to a portion of the upper surface of the at least one leadframe. Step 306 includes applying tape to the lower surface of the at least one leadframe. Step 308 includes placing a shunt at least partially in the open space such that it is in contact with the tape. Step 310 includes electrically connecting the integrated circuit device to the shunt and to the at least one leadframe. Step 312 includes encompassing at least portions of the at least one leadframe, the integrated circuit device and the shunt with a molding material. Finally, step 314 includes, thereafter, removing the tape from the lower surface of the at least one leadframe FIG. 11 is a flowchart depicting another embodiment of a method of manufacturing an integrated circuit package. With reference now to FIG. 11, step 402 includes providing at least one lead frame having an upper surface, an oppositely disposed lower surface and at least one open space extending through the at least one leadframe from the upper surface to the lower surface. Step 404 includes attaching an integrated circuit device to a portion of the upper surface of the at least one leadframe. Step 406 includes placing a shunt at least partially in the open space such that it is not in contact with any portion of the at least one leadframe. Step 408 includes electrically connecting the integrated circuit device to the shunt and to the at least one leadframe. Finally, step 410 includes, while maintaining the shunt not in contact with any portion of the at least one leadframe, encompassing at least portions of the at least one leadframe, the integrated circuit device and the shunt with a molding material.

As can be appreciated, the package and method described herein provide many advantages. The present method, for example, uses a relatively inexpensive tape 90 to hold the shunt 100 in place within the leadframe. Other applications use rivets to hold the shunt in place or tape which ultimately becomes encapsulated and incorporated in the finished device to secure the shunt on the leadframe. This type of tape is expensive as it must be die cut to a picture frame form. Further, the use of tape in this manner provides additional interfaces where later delamination might occur within the finished package. The use of rivets is disadvantageous for several reasons. Riveted attachments, for example, tend to take up more space—particularly since the rivets generally require tie straps extending from the leadframe. Further, a more complex leadframe and shunt result when rivets are used. Most significantly, the use of rivets negatively impacts the hermeticity of the overall package since additional paths for moisture ingress are created (i.e., the tie straps to which the rivets attach, one located at each end of the shunt). In the present process using the tape 90, the shunt 100 is fully encapsulated on five sides with only the bottom surface 101 exposed.

Another advantage provided by the package and method described herein is that, since the tape 90 is removed after encapsulation, it does not become part of the final package and, thus, does not pose a risk of causing delamination between the mold compound and the tape. The present package and method also allow customization of the shunt 100; the shunt, for example, can be formed from a different alloy than the leadframe 40 and/or the shunt 100 can be selectively plated with any desired material without the need to also plate the leadframe 40. Further, the size and shape of the shunt 100 can be easily changed with no need to change the configuration of the leadframe 40 (as long as the shunt 100 fits in the leadframe open space 80).

The foregoing description of specific embodiments has been presented for purposes of illustration and description. The specific embodiments described are not intended to be exhaustive or to suggest a constraint to the precise forms disclosed, and many modifications and variations are possible in light of the above teaching. The illustrated embodiments were chosen and described in order to best explain principles and practical application, to thereby enable others skilled in the art to best utilize the various embodiments with various modifications as are suited to the particular use contemplated.

It is intended that the scope of the disclosure herein be defined only by the claims appended hereto and their equivalents, except as limited by the prior art.

What is claimed is:

1. A method of manufacturing an integrated circuit package, comprising:
    providing at least one lead frame having an upper surface, an oppositely disposed lower surface and at least one open space extending through the at least one leadframe from said upper surface to said lower surface;
    attaching an integrated circuit device to a portion of said upper surface of said at least one leadframe;
    applying tape to the lower surface of said at least one leadframe;
    placing a shunt at least partially in said open space such that it is in contact with said tape;
    electrically connecting said integrated circuit device to said shunt and to said at least one leadframe;
    encompassing at least portions of said at least one leadframe, said integrated circuit device and said shunt with a molding material; and
    thereafter, removing said tape from said lower surface of said at least one leadframe.

2. The method of claim 1 and further wherein:
    said shunt is formed from an alloy comprising copper, manganese, and nickel.

3. The method of claim 1 and further wherein:
    said applying tape to the lower surface of said at least one leadframe comprises applying a pressure sensitive adhesive tape to said lower surface of said at least one leadframe.

4. The method of claim 1 and further wherein:
    said applying tape to the lower surface of said at least one leadframe comprises applying a thermoplastic tape to said lower surface of said at least one leadframe.

5. The method of claim 1 and further wherein:
    said shunt is not in contact with any portion of said at least one leadframe.

6. The method of claim 1 and further wherein:
    said placing a shunt at least partially in said open space such that it is in contact with said tape comprises fully supporting said shunt on said tape.

7. The method of claim 1 and further wherein:
    said providing at least one lead frame comprises providing a plurality of leadframes interconnected in a sheet; and
    said applying tape to the lower surface of said at least one leadframe comprises applying tape to lower surfaces of said plurality of leadframes.

8. A method of manufacturing an integrated circuit package, comprising:
    providing at least one lead frame having an upper surface, an oppositely disposed lower surface and at least one open space extending through the at least one leadframe from said upper surface to said lower surface;
    attaching an integrated circuit device to a portion of said upper surface of said at least one leadframe;
    placing a shunt at least partially in said open space such that it is not in contact with any portion of said at least one leadframe;
    electrically connecting said integrated circuit device to said shunt and to said at least one leadframe; and
    while maintaining said shunt not in contact with any portion of said at least one leadframe, encompassing at least portions of said at least one leadframe, said integrated circuit device and said shunt with a molding material.

9. The method of claim 8 and further comprising:
applying tape to the lower surface of said at least one leadframe prior to said electrically connecting said integrated circuit device to said shunt and to said at least one leadframe; and
wherein, said placing a shunt at least partially in said open space such that it is not in contact with any portion of said at least one leadframe comprises supporting said shunt on said tape.

10. The method of claim 9 and further comprising:
removing said tape from said lower surface of said at least one leadframe after said encompassing at least portions of said at least one leadframe, said integrated circuit device and said shunt with a molding material.

11. The method of claim 8 and further wherein:
said shunt is formed from an alloy comprising copper, manganese, and nickel.

12. The method of claim 9 and further wherein:
said applying tape to the lower surface of said at least one leadframe comprises applying a pressure sensitive adhesive tape to said lower surface of said at least one leadframe.

13. The method of claim 9 and further wherein:
said applying tape to the lower surface of said at least one leadframe comprises applying a thermoplastic tape to said lower surface of said at least one leadframe.

14. The method of claim 9 and further wherein:
said supporting said shunt on said tape comprises supporting said shunt only with said tape.

15. The method of claim 8 and further wherein:
said providing at least one lead frame comprises providing a plurality of leadframes interconnected in a sheet.

\* \* \* \* \*